(12) United States Patent
Zhang et al.

(10) Patent No.: US 10,329,657 B2
(45) Date of Patent: Jun. 25, 2019

(54) COATED SUBSTRATE

(71) Applicant: Teer Coatings Limited, Droitwich, Worcestershire (GB)

(72) Inventors: Xiaoling Zhang, Droitwich (GB); Kevin Cooke, Droitwich (GB)

(73) Assignee: Teer Coatings Limited, Droitwich, Worcestershire (GB)

( * ) Notice: Subject to any disclaimer, the term of this patent is extended or adjusted under 35 U.S.C. 154(b) by 70 days.

(21) Appl. No.: 15/570,850

(22) PCT Filed: Apr. 29, 2016

(86) PCT No.: PCT/GB2016/051242
§ 371 (c)(1),
(2) Date: Oct. 31, 2017

(87) PCT Pub. No.: WO2016/178003
PCT Pub. Date: Nov. 10, 2016

(65) Prior Publication Data
US 2018/0148825 A1    May 31, 2018

(30) Foreign Application Priority Data

May 1, 2015 (GB) .................................. 1507524.5

(51) Int. Cl.
*C23C 16/30* (2006.01)
*C23C 14/06* (2006.01)
(Continued)

(52) U.S. Cl.
CPC ....... *C23C 14/0623* (2013.01); *C10M 103/06* (2013.01); *C10M 105/72* (2013.01);
(Continued)

(58) Field of Classification Search
CPC ............ C23C 14/0623; C23C 14/0617; C23C 14/025; C23C 16/305; C10M 103/06;
(Continued)

(56) References Cited

U.S. PATENT DOCUMENTS 5,002,798 A * 3/1991 Donley ................ C10M 103/06
427/248.1
6,423,419 B1 * 7/2002 Teer ........................ C23C 14/02
420/429

(Continued)

OTHER PUBLICATIONS

Baran, Ozlem et al. (Investigation of the friction and wear properties of Ti/TiB2/MoS2 graded-composite coating deposited by CFUBMS under air and vacuum conditions) (Year: 2014).*

(Continued)

*Primary Examiner* — Zandra V Smith
*Assistant Examiner* — Jeremy J Joy
(74) *Attorney, Agent, or Firm* — Head, Johnson, Kachigian & Wilkinson, PC

(57) ABSTRACT

The invention to which this application relates is improvements to the provision of Molybdenum and/or Tungsten containing coatings of the type which can be used to improve certain characteristics of the surface of a substrate to which the coating is applied. In one embodiment the coating also includes Ti to provide the advantages of high adhesion, high humidity and wear resistance of the coating and $TiB_2$ to promote the formation of a relatively uniform, dense, coating, so strengthening the coating which is formed and improving the high temperature performance of the coatings.

18 Claims, 7 Drawing Sheets

(51) Int. Cl.
*C23C 14/02* (2006.01)
*C10M 177/00* (2006.01)
*C10M 107/46* (2006.01)
*C10M 105/72* (2006.01)
*C10M 103/06* (2006.01)

(52) U.S. Cl.
CPC ........ *C10M 107/46* (2013.01); *C10M 177/00* (2013.01); *C23C 14/025* (2013.01); *C23C 14/0647* (2013.01); *C23C 16/305* (2013.01); *C10M 2201/0603* (2013.01); *C10M 2201/0663* (2013.01)

(58) Field of Classification Search
CPC .............. C10M 105/72; C10M 105/78; C10M 16/00–06; C10M 2201/066–0663; C10M 2201/087–0873; C10M 2219/00–108; C10M 2221/00–043
See application file for complete search history.

(56) References Cited

U.S. PATENT DOCUMENTS

| | | | | |
|---|---|---|---|---|
| 7,485,372 | B2* | 2/2009 | Inoue | C23C 14/027 |
| | | | | 204/192.11 |
| 2003/0219622 | A1* | 11/2003 | Niebauer | B32B 15/01 |
| | | | | 428/663 |
| 2004/0179762 | A1* | 9/2004 | Doll | F16C 33/445 |
| | | | | 384/492 |
| 2007/0284255 | A1* | 12/2007 | Gorokhovsky | C23C 16/06 |
| | | | | 205/89 |
| 2008/0031557 | A1* | 2/2008 | Yamanaka | C23C 14/0623 |
| | | | | 384/463 |

OTHER PUBLICATIONS

Baran, Ozlem et al.: "Investigation of the friction and wear properties of Ti/TiB2/MoS2 graded-composite coatings deposited by CFUBMS under air and vacuum conditions", Surface and Coatings Technology Elsevier B.V. Netherlands, vol. 260, Dec. 15, 2014, pp. 310-315, XP002760224, ISSN: 0257-8972.

Bidev, Faruk et al.: "Adhesion and fatigue properties of Ti/TiB2/MoS2 graded-composite coatings deposited by closed-field unbalanced magnetron sputtering", Surface and Coatings Technology Elsevier Science S.A. Switzerland, vol. 215, Jan. 25, 2013, pp. 266-271, XP002760225, ISSN: 0257-8972.

Steinmann M et al.: "A new type of tribological coating for machine elements based on carbon, molybdenum disulphide and titanium diboride", Tribology International, Butterworth Scientific Ldt, Guildford, GB, vol. 37, No. 11-12, Nov. 1, 2004, pp. 879-885, XP004614306, ISSN: 0301-679X, DOI: 10.1016/J.Triboint.2004.07.003.

* cited by examiner

COATED SUBSTRATE

The invention to which this application relates is improvements to the provision of Molybdenum and/or Tungsten containing coatings of the type which can be used to improve certain characteristics of the surface of a substrate to which the coating is applied.

One such known coating is that described in the applicant's patent EP0842306 for an $MoS_2$ and Titanium containing coating. While this form of coating has been found to be extremely successful in providing a relatively hard, wear resistant coating with low friction characteristics, problems can be encountered in the manufacture and application of the coating which act to prevent the more extensive commercial use of coatings of this type. The problems of $MoS_2$ can include sensitivity to humidity which conventionally has meant that the coating has had to be applied in relatively controlled dry environments and typically under vacuum. Other problems with other Mo containing coatings include that the coatings have to be relatively thin and so the wear life and working temperature are limited as is set out below.

It is also known that existing $MoS_2$ coatings which typically have a columnar structure, tend to break up between the upper parts of the columns and the portions of the columns at the base and this can mean that as the columns fall apart and disintegrate it is effectively only the base region of the coating which is left to act as a lubricating layer. This, in turn, means that the effective thickness of the lubricant coating is very limited and so the effective thickness of conventional $MoS_2$ based coatings has been restricted to about 1 µm.

These, and other problems with the potential breaking up of the coating if not applied properly, mean that the thickness of coating which can practically be applied is relatively limited (typically ~1 µm), due to the tendency of the coating to break down at greater thicknesses, and/or the maximum working temperature of the coating is limited ~350° C.

An aim of the present invention is to provide a coating and a method of applying the same which allows the utility of coatings of this type to be increased by improving the stability of the same and/or increasing the thickness of the coating which can be applied, whilst, at the same time, allowing the characteristics of the coating to be at least maintained.

In a first aspect of the invention there is provided a coating applied to a surface of a substrate wherein said coating includes one or more of $MS_x$, and/or $MSe_x$ where M is a Molybdenum (Mo) and/or Tungsten (W) and x=0.8 to 2.

Typically x=2.

Typically the coating also includes carbon and/or Boron.

In one embodiment the coating includes at least one of Titanium, Zirconium, Nickel, Cobalt, lead, Chromium, Gold, Silver, Carbon, Molybdenum, Niobium, Tantalum, PTFE and/or Tungsten, but most preferably Titanium.

In one embodiment the coating includes at least one of $CaF_2$, $BaF_2$, $CeF_3$, $LaF_3$; PbO, NiO, $Cu_2O$, $ZrO_2$, $Ag_2O$, $Al_2O_3$, $Sb_2O_3$; $TiB_2$, $ZrB_2$, $CrB_2$, Boron Carbide, Boron Nitride, Silicon Nitride, Titanium Nitride, Titanium Carbide, Silicon Carbide and/or Tungsten Carbide.

In one embodiment the $MoS_2$ and metal material and the metal boride material are applied as distinct layers so as to form the coating. In an alternative embodiment the $MoS_2$ and metal and the metal boride are co-deposited to form an intimate mixture.

In one embodiment the coating is formed from a plurality of $MoS_2/TiB_2$ nano-scale multilayers which can be applied to build up the thickness of the same to, for example, 4.0 µm if required, while the wear rate of the coating is at least maintained.

In one embodiment the wear rate of the coating is $1\times10^{-17}$ $m^3 N^{-1} m^{-1}$.

In one embodiment the increase in the thickness of the coating increases the wear life of the coating.

In one embodiment the working temperature of the coating is >450° C.

In one embodiment the coating is used as a solid lubricant coating for an article including any, or any combination of, moulding; forming; dry drilling and cutting; sheet-drawing; heavy duty sliding bearings, gears and other components or parts, such as piston rings, cylinder liners, valve stems, rollers and parts working under minimum quantity lubrication and dry working conditions.

In one embodiment the coating which is formed is nanocrystalline and the basal planes of the nano-crystals are substantially parallel to the substrate surface.

In one embodiment this alignment results from the use of the coating and/or subsequent working of the coating once applied by mechanical realignment under the action of a counter-surface with relative motion to the coated surface which can be controlled to achieve alignment of the basal planes in the direction of the motion and normal to the applied load.

Typically the coating has a substantially nano-crystalline structure.

In a further aspect of the invention there is provided a substrate including a coating as hereinbefore described.

In a further aspect of the invention there is provided apparatus for applying a coating to an article by sputter depositing material from targets provided with respective magnetrons, said magnetrons provided in a chamber in which a carrier is located and on which the substrates to which the coating is to be applied are mounted, said magnetrons including a magnetron with a target including Molybdenum which is to be deposited as part of the coating and said magnetrons and/or magnet arrays are provided in the chamber to operate in a closed field configuration.

Typically the sputtering is performed using unbalanced magnetron sputtering techniques.

In one embodiment the apparatus includes first and second magnetrons each with an MoSx target, a magnetron with a target of Ti and a further magnetron with a target including Boron material. In on embodiment the said target is formed from $TiB_2$ or other compound materials.

In one embodiment the Ti target is activated to apply an initial layer of Ti on the surface of the substrate to act as an adhesion layer for the coating to the substrate.

In one embodiment argon gas or another inert gas is introduced into the chamber during the sputter deposition of material.

In one embodiment the substrates are held at a negative bias and preferably the bias is greater during an initial cleaning step in comparison to the bias when applying the sputter deposited material.

In one embodiment a pulsed DC power supply is used.

In a further aspect of the invention there is provided A method for forming a coating on a substrate surface, said method comprising the steps of:

applying a layer of Ti to the surface of the substrate, applying a ramping layer of material during which material in addition to Ti starts to be applied to the Ti layer and provided in the form of layers of $MS_x$, and/or $MSe_x$, Ti and TiB$_2$ multilayers; and forming a top or outer layer composed of multiple layers of MS$_x$, and/or MS$_x$+Ti and TiB$_2$ where M is Molybdenum or Tungsten.

Typically the MS$_x$ is applied in the form of MoS$_2$.

In one embodiment the sequence of operation is such that the operation of the magnetrons to sputter material from the Boron containing targets is commenced before the magnetrons with the MoS$_2$ targets are operated.

Typically, once the operation of all of the magnetrons has commenced at least the magnetrons with the MoS$_2$ targets are continuously operated until the coating is completed. In one embodiment the Titanium target magnetron is operated continuously until the coating is completed.

In addition or alternatively one or more of the magnetrons can be selectively turned off. Typically in this case the magnetron and/or target can be provided to be selectively covered, such as by a shutter, when switched off in order to minimise the possibility of cross-contamination of the same from other operating magnetrons in the system.

Specific embodiments of the invention are now described with reference to the accompanying drawings; wherein FIG. 1 illustrates the surface topography of a coating formed in accordance with one embodiment of the invention;

Figure 4:
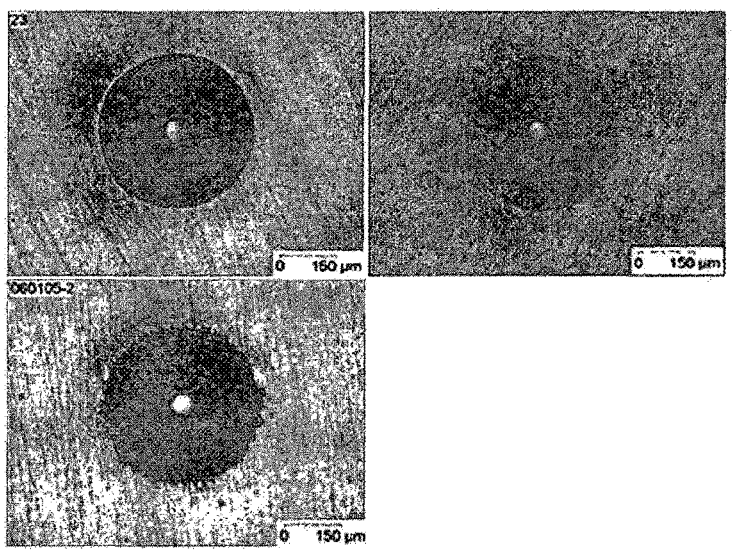
Figure 5:
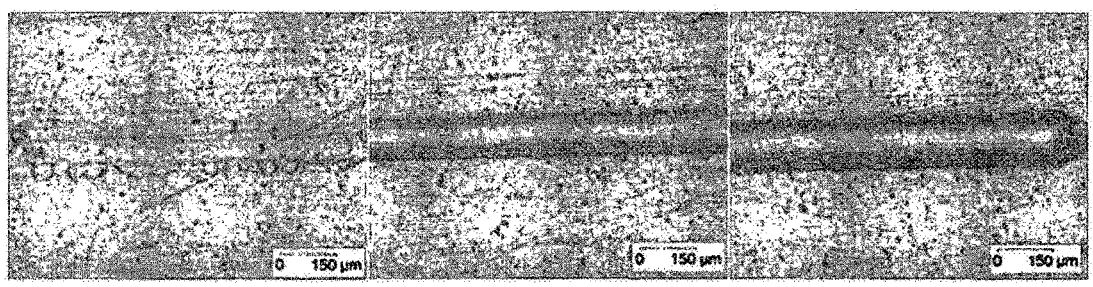
Figure 6:
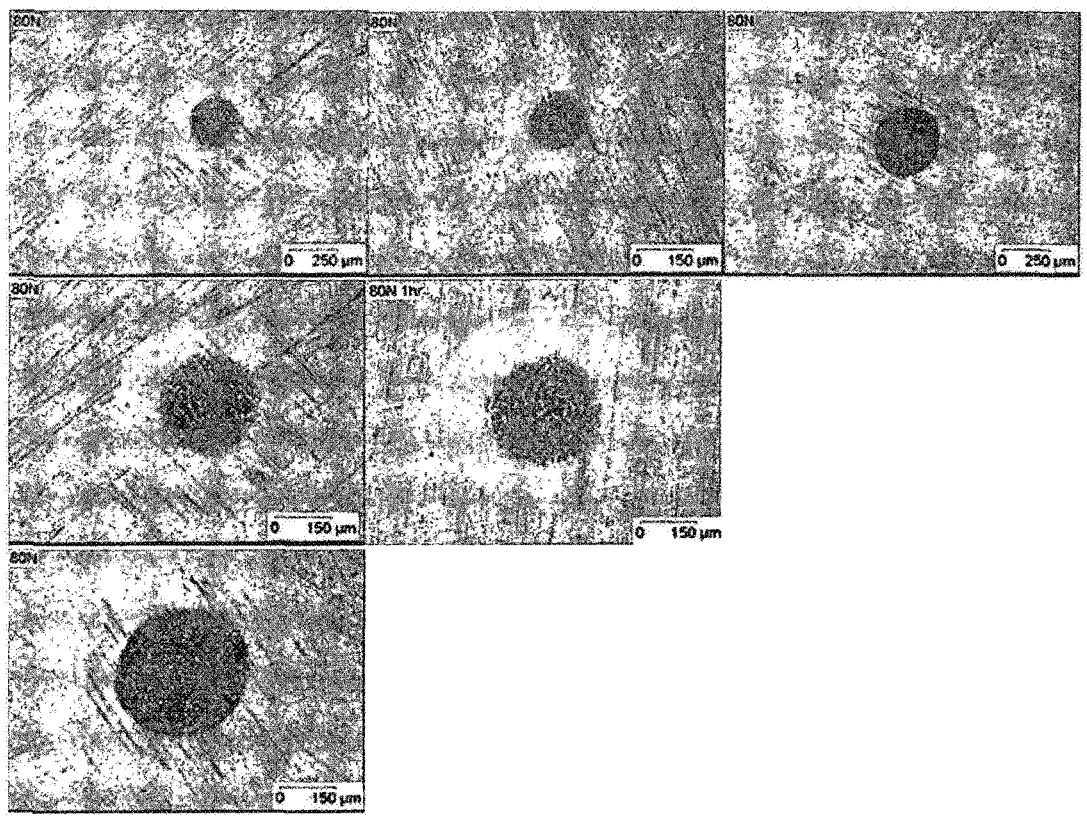
Figure 7:
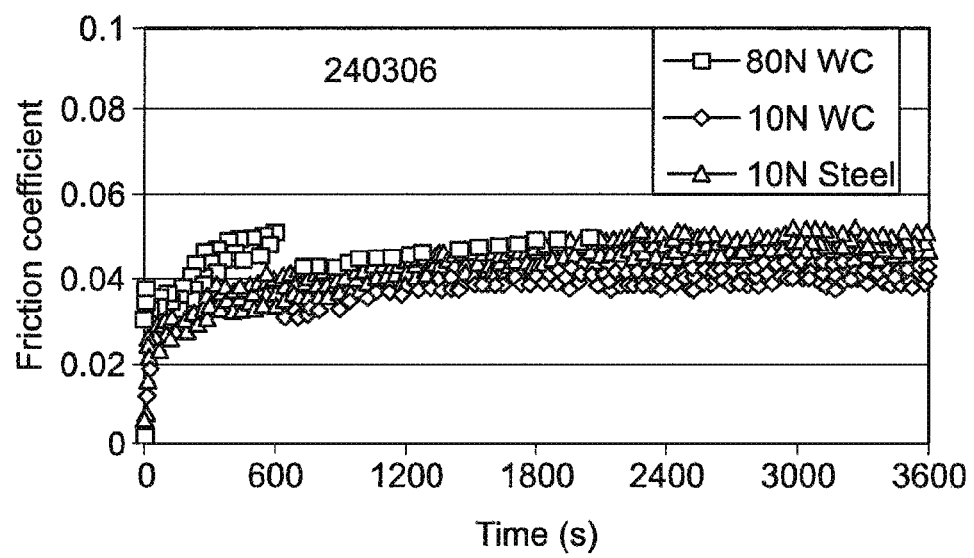
Figure 8:
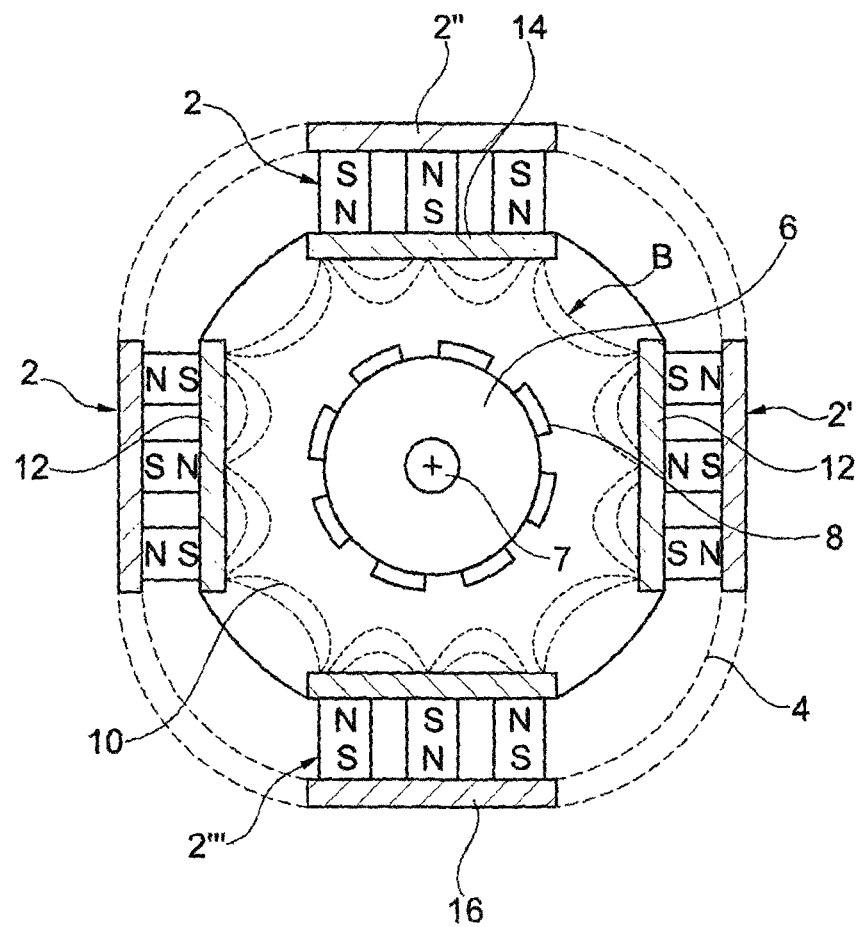
Figure 9:
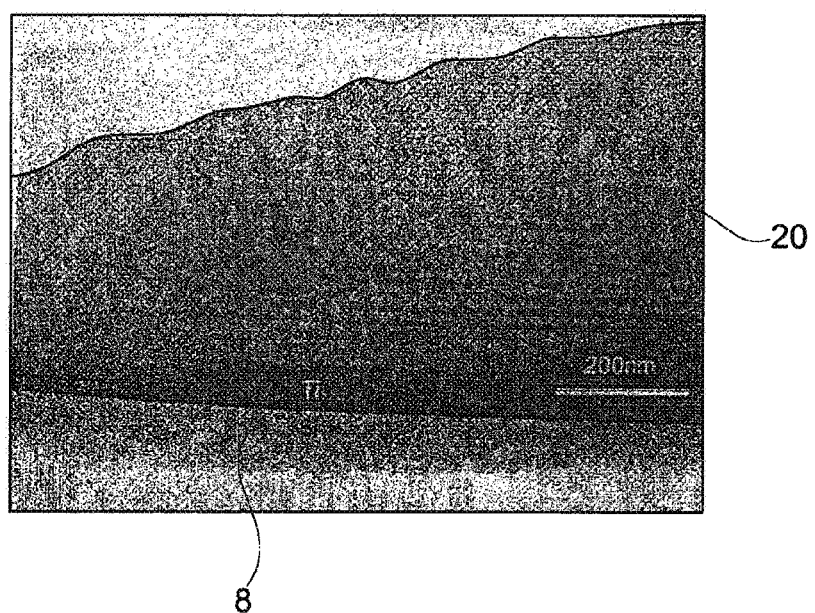
Figure 10:
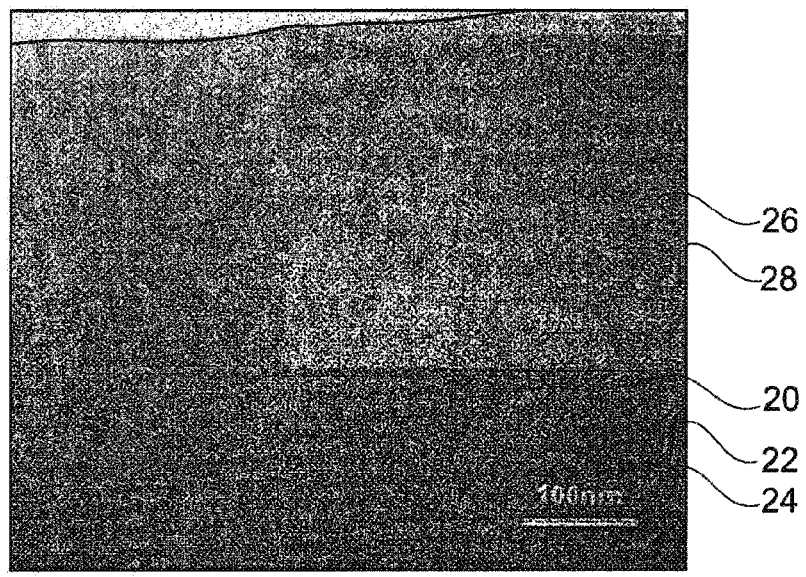

FIG. 4 provides Rockwell indentation results of (a) 1.3 (b) 2.1 and (c) 3.8 μm thickness of a coating formed in accordance with the invention;

FIG. 5 illustrates scratch testing results of coating formed in accordance with the invention;

FIG. 6 provides a taper cross-section of wear tracks of coatings of (a) 1.3, (b) 2.1 and (c) 3.8 μm, following ball-on-disc tests at 80 N for 720 m FIG. 7 illustrates the friction coefficient of a coating in accordance with the invention sliding against WC+Co and steel ball in ball-on-disc tests in ambient condition under different normal loads;

FIG. 8 illustrates apparatus for use in the application of coatings in accordance with one embodiment of the invention;

FIG. 9 illustrates a TEM cross sectional image of a coating formed in accordance with one embodiment of the invention; and FIG. 10 illustrates TEM image of part of a coating formed in accordance with the invention.

It is preferred that the coating which is formed in accordance with the invention and which, in this embodiment, comprises MoS2, Ti and TiB$_2$, is deposited by sputter depositing material from targets provided with respective magnetrons using apparatus as illustrated in FIG. 8.

The magnetrons 2 are provided in a chamber 4 on which a carrier 6 on which the substrates 8 to be coated are mounted for movement, most typically by rotation of the carrier about axis 7, or, alternatively, by linear movement, is located.

In one embodiment, the magnetrons 2 are provided in a closed field configuration and, if necessary, one or more magnet arrays can be provided in order to allow the closed field to be formed so as to trap the electrons therein and hence improve and intensify the magnetic field 10 in which the carrier is located, with the sputtering of the materials performed using unbalanced magnetron sputtering techniques.

In one embodiment, the apparatus includes first and second magnetrons 2,2', each with an MoS$_2$ target 12, a magnetron 2" with a target 14 of Ti and a further magnetron 2''' with a target 16 of TiB$_2$ material. In the embodiment described herein the pressure in the chamber 4 before deposition was around 5~6×10$^{-6}$ Torr and argon gas was introduced into the chamber and provided at a sputtering pressure of approximately 3.0×10$^{-3}$ Torr. The distance between the targets and the substrates to be coated wit he coating and which are held on the carrier is 150 mm and a pulsed DC power supply is used to provide a negative bias, in this case about −350 V bias on the substrates, during a cleaning step in which the substrates are cleaned and at a bias in the region of −45 V during the selective sputter deposition of material from the targets during deposition.

In the first step of the coating application method a thin layer of Ti is applied to the surface of the substrates to act as an adhesion layer for the subsequent coating material to the substrate 8. Subsequently, the coating is formed in accordance with the invention with the carrier being rotated about axis 7 so as to move the substrates in front of each of the targets 12,14,12,16 in turn. A suitable speed of rotation is 4.0 rpm with the temperature of the substrates during the deposition process maintained at a temperature lower than 150° C.

During the method, a current is applied to the Ti and TiB$_2$ target magnetrons to cause the sputtering of the material therefrom onto the substrates and the current is varied as shown in Table 1 in order to optimize the tribological properties of the deposited coatings. The sputtering current of the MoS$_2$ target magnetrons is set at 0.6 A, and the coating thickness is controlled to be at about 1.30 micrometers in the optimization stage.

TABLE 1

| sputtering current applied to the magnetrons with Ti and TiB$_2$ targets | | | | | |
|---|---|---|---|---|---|
| Ti | 0 | 0.3 | 0.5 | 0.7 | 0.8 |
| TiB$_2$ | 0.4 | 0.6 | 0.8 | 1.0 | 1.2 |

In the method described herein the substrates used are an M42 steel test piece to allow for analysis of the tribological properties of the coating applied thereto and a Si wafer was coated for the purposes of analysis of the structure of the coating applied thereto. The adhesion of the coatings to the respective substrates was measured using a Teer ST3001 scratch/wear apparatus using a Rockwell diamond tip sliding against the coating with a load increasing by 100 N min$^{-1}$ from 10 to 100 N at a sliding speed of 10 mm min$^{-1}$. The scratch critical load Lc of the coating was determined by visual observation in an optical microscope and defined as the point at which coating delamination was first observed either in, or at the edge of, the scratch track. A standard Rockwell-C indentation test under a load of 150 kg was also used as an indication of adhesion (HF).

The plastic hardness of the coatings was determined using a Fischerscope H100 tester with a Vickers indentor from the load penetration curves. Five indents were made on each sample and the data from the same was averaged. The loading/unloading rate was 10 m N s$^{-1}$, with a maximum applied load of 50 mN.

The tribological behaviour of the coatings was determined using a Teer POD-2 pin-on-disc tester. The test used a WC—Co ball of 5 mm diameter, which was loaded on top of the coated flat samples at normal loads of 20 N, 40 N or 80 N. The flat sample was rotating at a controlled speed while the ball remained at a fixed position, so that the linear sliding speed between the counterbodies was set at 200 mm s$^{-1}$. The tests were conducted for 60 min. at an ambient condition with the relative humidity level of 30~40%. The wear volume was determined by producing a ball crater on the wear track.

The surface and cross-sectional morphology and structure of the coatings were analysed using a JEOL 7000 FEG Scanning Electron Microscope (SEM) and a Philips CM20. The coatings were therefore deposited at different conditions by varying the sputtering current on the Titanium and Boron target magnetrons. As shown in Table 2, coatings with a coefficient of friction of 0.02-0.06 and a wear rate of 1×10$^{-17}$ m$^3$ N$^{-1}$ m$^{-1}$ in ball-on-disc tests conducted in ambient air, were achieved even with the coating thickness increased up to 4.0 μm. Furthermore, the thicker the coating that is applied then the longer the wear life as shown by the prolonged ball-on-disc test results of Table 2, which show that the wear life of the coatings in ball-on-disc test under 80 N normal load, are increased from about 2 hrs to about 12 hrs with the thickness of the coatings increased from 1.3 μm to 3.8 μm.

TABLE 2

Testing results on coatings with different thicknesses

| Thickness μm | Lc N | HF | Friction coefficient | Wear rate m/Nm | Wear life hr |
|---|---|---|---|---|---|
| 1.3 | 100 | 2 | 0.03 | 8 × 1$^{-18}$ | 2 |
| 2.1 | 100 | 3 | 0.04 | 1 × 10$^{-17}$ | 6 |
| 3.8 | 100 | 4 | 0.04 | 2 × 10$^{-17}$ | 12 |

Note:
the friction and wear properties are the pin-on-disc results at a normal load of 80N.

Figure 1:
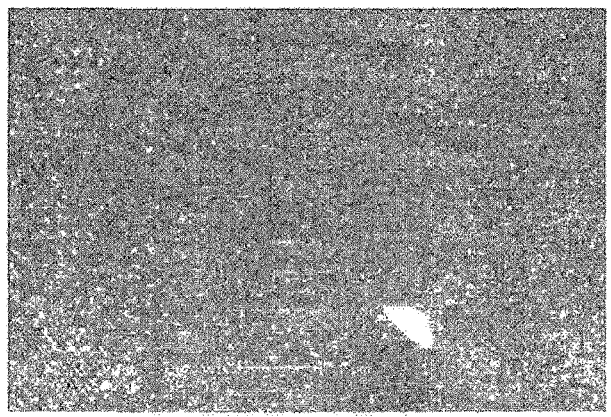
Figure 2:
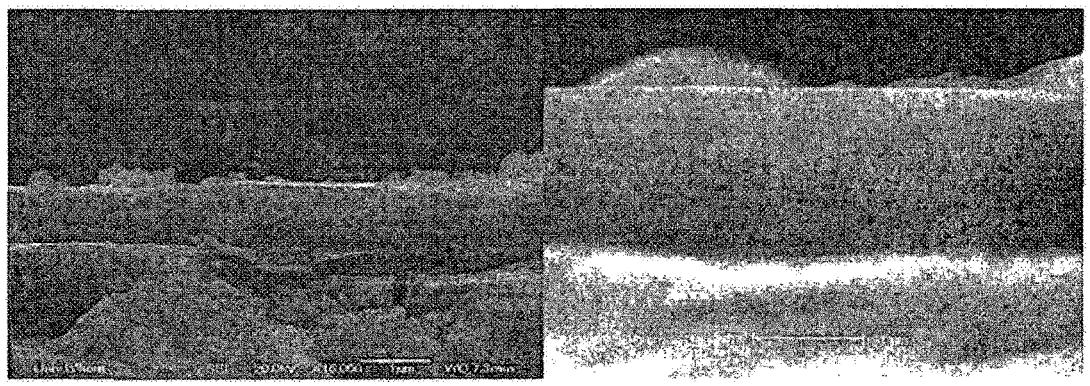
FIG. 2 illustrates a SEM cross-section of a coating formed in accordance with one embodiment of the invention.
Figure 3:
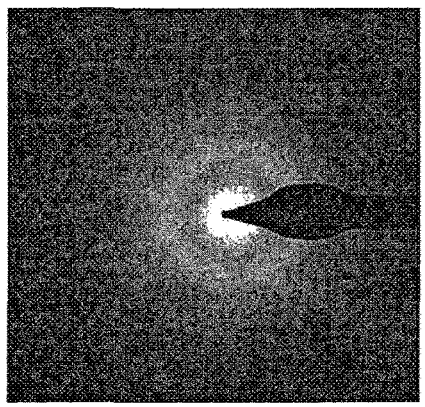
FIG. 3 illustrates the diffraction pattern of a coating formed in accordance with one embodiment of the invention.

SEM observation of the surface as shown in FIG. 1 and the fractured cross-section as shown in FIG. 2 of the coating revealed that the coating is very dense without any pores or columnar feature. The diffraction pattern of the coating in FIG. 3 by TEM shows that the coating is in an amorphous structure.

The detected hardness of the coatings was found to be in the region of 900 kg/mm$^2$ and the indentation tests show that the HF level increased as the coatings become thicker, but could still be less than HF 4 for up to 4.0 μm thick coatings as shown in Table 2 and in FIG. 4. The scratch tests show that the total failure load of all the coatings with different thickness is more than 100 N, although some edge chipping or isolated flakes could be seen at the beginning or in the middle of the scratch trace shown in FIG. 5.

It is therefore shown that the high wear resistance of the coating, in the region of 1×10$^{-17}$ m$^3$ N$^{-1}$ m$^{-1}$, is maintained even when the coating thickness is increased up to 4.0 micrometers as illustrated in Table 2 and FIG. 6.

This is significant for the practical usages of the coating, as the lifetime of the coated substrate increases accordingly.

Thus, the provision of the Ti material continues to provide the advantages of high adhesion, high humidity and wear resistance while the addition of TiB$_2$ promotes the formation of a relatively uniform, dense, coating, so strengthening the coating which is formed and improving the high temperature performance of the coatings.

FIG. 7 illustrates a typical friction coefficient curve of the coating in accordance with the invention sliding against a WC+Co ball in a ball-on-disc test performed in ambient air at different normal loads. The friction coefficient is lower than 0.05 even at a low load and so it is found that the higher the normal loads, the lower the friction coefficient of the coatings.

The TEM images in FIGS. 9 and 10 show a cross section through the coating 20 formed in accordance with the invention, with FIG. 9 including the substrate 8 on which the coating is formed. FIG. 10 is focused on the main part of the coating formed in accordance with one embodiment of the invention and shows that the coating, in this embodiment is built up by the repeating of two bands, i.e. the dark band 22 (MoS$_2$ and Ti); and the bright band 24 (MoS$_2$ and Ti and TiBZ). It can be seen in the detailed portion 26 of FIG. 10 that within the bright band, bright stripes 28 (TiB$_2$ layers) are sandwiched between the dark stripes (MoS$_2$ and Ti).

The thickness of the dark band (MoS$_2$ and Ti) band indicates that the dark band in FIG. 9 is composed of four basal-oriented (MoS$_2$ and Ti) monolayers. With the inclusion of TiB$_2$ in the bright band, the growth of the (MoS$_2$ and Ti) layer is interrupted hence effectively two basal-oriented (MoS$_2$ and Ti) monolayers are deposited. That is, the bright band in FIG. 9 is formed with two nano-scale-basal-oriented (MoS$_2$ and Ti) monolayers sandwiched between nano-layers of TiB$_2$.

Thus the coating achieved in accordance with the invention achieves a dense, amorphous structure shown by SEM, XRD and TEM analyses with high load bearing capacity and excellent tribological properties of the coatings shown by ball-on-disc tests at ambient conditions and so the thickness of the coatings can be increased to 4.0 μm while the specific wear rate of the coatings, 1×10$^{-17}$ m$^3$ N$^{-1}$ m$^{-1}$, is maintained at the same level as that of a 1.0 μm thick coating.

This is significant for the practical applications of solid lubricant coatings as the same can be applied to substrates for use in cutting and forming industries and in addition for substrates for use in heavy duty, long endurance and high reliability requirements and for substrates for use as components with high roughness.

The invention claimed is:

1. A coating applied to a surface of a substrate wherein said coating comprises:
   MS$_x$, and/or MSe$_x$x , where M is Molybdenum (Mo),. and Tungsten (W) and x=0.8 to 2 and wherein the coating includes repeating layers of two forms, a first form including MS$_x$ and/or MSe$_x$ and Ti; and a second form including MS$_x$, and/or MSe$_x$, Ti and TiB2 and within this form of layer, layers of the TiB2 material are sandwiched between layers of MS$_x$, and/or MSe$_x$ and Ti.

2. A coating according to claim 1 wherein x=2.

3. A coating according to claim 1 wherein the coating also includes carbon.

4. A coating according to claim 1 wherein the coating includes at least one of Zirconium, Nickel, Cobalt, lead, Chromium, Gold, Silver, Carbon, Niobium, Tantalum, PTFE.

5. A coating according to claim 1 wherein the coating includes at least one of CaF$_2$, BaF$_2$, CeF$_3$, LaF$_3$; PbO, NiO, Cu$_2$O, ZrO$_2$, Ag$_2$O, Al$_2$O$_3$, Sb$_2$O$_3$; TiB$_2$, ZrB$_2$, CrB$_2$, Boron Carbide, Boron Nitride, Silicon Nitride, Titanium Nitride, Titanium Carbide, Silicon Carbide and/or Tungsten Carbide.

6. A coating according to claim 1 wherein the coating includes an MoS$_2$ layer, a metal material layer and a metal boride layer.

7. A coating according to claim 1 wherein the coating is formed of MoS$_2$ a metal material layer and a metal boride which are co-deposited to form an intimate mixture.

8. A coating according to claim 1 wherein the coating is formed from a plurality of Molybdenum disulphide/metal composite and $TiB_2$ nano-scale multilayers which are applied to form the coating of required thickness whilst substantially maintaining the wear rate of the coating which is formed.

9. A coating according to claim 8 wherein at a coating thickness of up to 4.0 μm the wear rate of the coating is at least $1\times10^{-17}$ $m^3$ $N^{-1}$ $m^{-1}$.

10. A coating according to claim 1 wherein the working temperature of the coating is >450° C.

11. A coating according to claim 1 wherein the coating is nano-crystalline and the basal planes of the nano-crystals are substantially parallel to the substrate surface to which the coating is applied.

12. An article with a coating as described in claim 1 applied to a surface thereof.

13. An article according to claim 12 wherein the coating is used to form a solid lubricant surface coating for the article which is used in any, or any combination of, moulding; forming; dry drilling and cutting; sheet-drawing; heavy duty sliding bearings, gears, piston rings, cylinder liners, valve stems, and/or rollers.

14. A method according to claim 1 wherein at least one magnetron is provided in association with a target including Titanium and that magnetron, once operation of the same has commenced, is operated continuously until the coating is completed.

15. A method for forming a coating on a substrate surface, said method comprising the steps of:
applying a layer of Ti to the surface of the substrate
applying a ramping layer of material during which material, in addition to Ti, starts to be applied to the Ti layer and wherein the method includes the steps of applying repeating layers of two forms, a first form including $MS_x$, and/or $MSe_x$ where M is Molybdenum or Tungsten and Ti, and a second form including $MS_x$, and/or $MSe_x$, Ti and TiB2 and within this form of layer, layers of the TiB2 material are sandwiched between layers of $MS_x$, and/or $MSe_x$ and Ti.

16. A method according to claim 15 wherein $MS_x$, is applied in the form of $MoS_2$.

17. A method according to claim 16 wherein the sequence of operation is to operate one or more magnetrons which are associated with a target which includes Boron to sputter material therefrom before the magnetrons associated with the $MoS_2$ targets are operated.

18. A method according to claim 17 wherein once the operation of all of the magnetrons has commenced at least the magnetrons with the $MoS_2$ targets are continuously operated until the coating is completed.

* * * * *